United States Patent [19]

Schlenk

[11] Patent Number: 4,533,865
[45] Date of Patent: Aug. 6, 1985

[54] CIRCUIT ARRANGEMENT FOR IDENTIFYING AND STORING POWER LINE FAULTS

[75] Inventor: Manfred Schlenk, Augsburg, Fed. Rep. of Germany

[73] Assignee: Siemens Aktiengesellschaft, Berlin & Munich, Fed. Rep. of Germany

[21] Appl. No.: 465,117

[22] Filed: Feb. 9, 1983

[30] Foreign Application Priority Data

Mar. 16, 1982 [DE] Fed. Rep. of Germany ....... 3209562

[51] Int. Cl.³ ...................... G08B 21/00; G01R 31/02
[52] U.S. Cl. ........................................ 324/51; 340/663
[58] Field of Search .............. 340/662, 663, 660, 654, 340/664; 361/86; 324/51; 307/200 A

[56] References Cited

U.S. PATENT DOCUMENTS

| | | | |
|---|---|---|---|
| 3,775,675 | 11/1973 | Freeze | 340/664 X |
| 4,099,068 | 7/1978 | Kobayashi | 340/654 X |
| 4,340,852 | 7/1982 | Togneri | 324/51 |
| 4,389,640 | 6/1983 | Dawdy | 340/664 |

Primary Examiner—Stanley T. Krawczewicz
Assistant Examiner—Jose M. Solis
Attorney, Agent, or Firm—Hill, Van Santen, Steadman & Simpson

[57] ABSTRACT

A circuit arrangement detects and stores power line faults. The occurrence of sporadic faults as represented, for example, by inadmissibly long network collapses, which could lead to shut-down of a current supply and, therefore, to downtime of a computer are generally difficult to detect because the faults disappear given a return of the network, as does, therefore, the prerequisite for detecting the cause of such faults. For the purpose of detecting the cause of the fault, the rectified power line voltage is supplied to a comparison circuit followed by a signal circuit. The signal circuit is connected to a memory which influences a display. As a result, power line faults remain stored despite the return of the power line input voltage. The circuit arrangement is particularly suitable for use in power supply systems for data processing devices.

2 Claims, 2 Drawing Figures

CIRCUIT ARRANGEMENT FOR IDENTIFYING AND STORING POWER LINE FAULTS

BACKGROUND OF THE INVENTION

1. Field of the Invention

The present invention relates to a circuit arrangement for identifying and storing power line faults, and in particular for a circuit arrangement for displaying the identity of faults.

2. Description of the Prior Art

The high expense of downtime which arrives for an outage of modern data processing systems require that the causes of such outages be detected as quickly and reliably as possible. Particularly difficult is the identification of sporadic faults as represented, for example, by inadmissibly long power line collapses, which can lead to a shut-off of the power supply and, therefore, to the outage, for example, a computer.

SUMMARY OF THE INVENTION

The object of the present invention, therefore, is to provide a circuit arrangement for identifying and storing power line faults, which faults remain displayed after the elimination of the originating causes.

The above object is achieved, according to the present invention, by a circuit arrangement which is designed such that the rectified line voltage is supplied to a comparison circuit which feeds a signal circuit, the signal circuit being connected to a memory which influences a display.

In particular, the circuit arrangement can also be designed such that the comparison circuit comprises a Wheatstone bridge having one arm comprising a Zener diode which is connected to reference voltage source, an output of the rectifier circuit connected to one diagonal of the bridge, and an operational amplifier having an input connected to the other diagonal. The store or memory comprises a bistable relay driven by a monostable flip-flop, the relay being charged with an inhibit voltage for the start-up mode. The display comprises a reset circuit and a display circuit. The bistable relay is driven via a transistor and is reset into its initial condition by way of a reset voltage. The display circuit is formed by a light-emitting diode.

As a result of the above structure, a device is provided by which power line faults can be displayed and remain stored after the shut-down of the system up to the next time the system is turned on or, respectively, despite the return of the power line input voltage.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Figure 1:
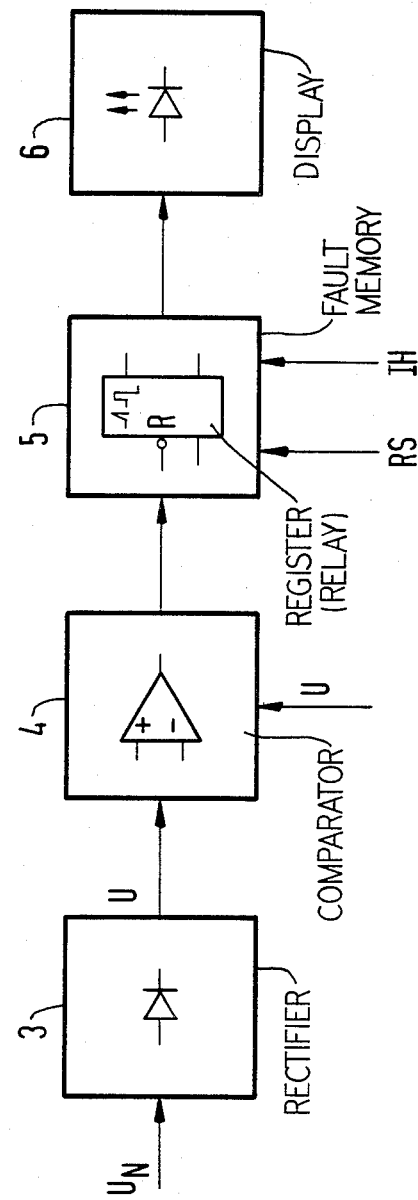
FIG. 1 is a block circuit diagram for fault recognition and fault storage.

The principles of fault recognition and fault storage are illustrated in FIG. 1.

For the purpose of power line monitoring, the rectified line input voltage $U_{ist}$ is compared to a reference value $U_{soll}$. When the voltage $U_{ist}$ falls below the reference value $U_{soll}$, the power line monitoring circuit emits a fault signal. This is indicated in FIG. 1 where the power line voltage $U_N$ is rectified by a rectifier 3 which feeds the rectified voltage $U_{ist}$ to a comparator 4 which also receives the reference voltage $U_{soll}$. A fault memory 5, including a register, responds and causes display of the fault at a display 6. This alarm can be canceled by way of a reset signal RS. An inhibit signal IH serves to block the memory during run-up of the rectified power line input voltage. Moreover, this signal is also employed to inhibit the memory when the overall data processing system is turned off.

Figure 2:
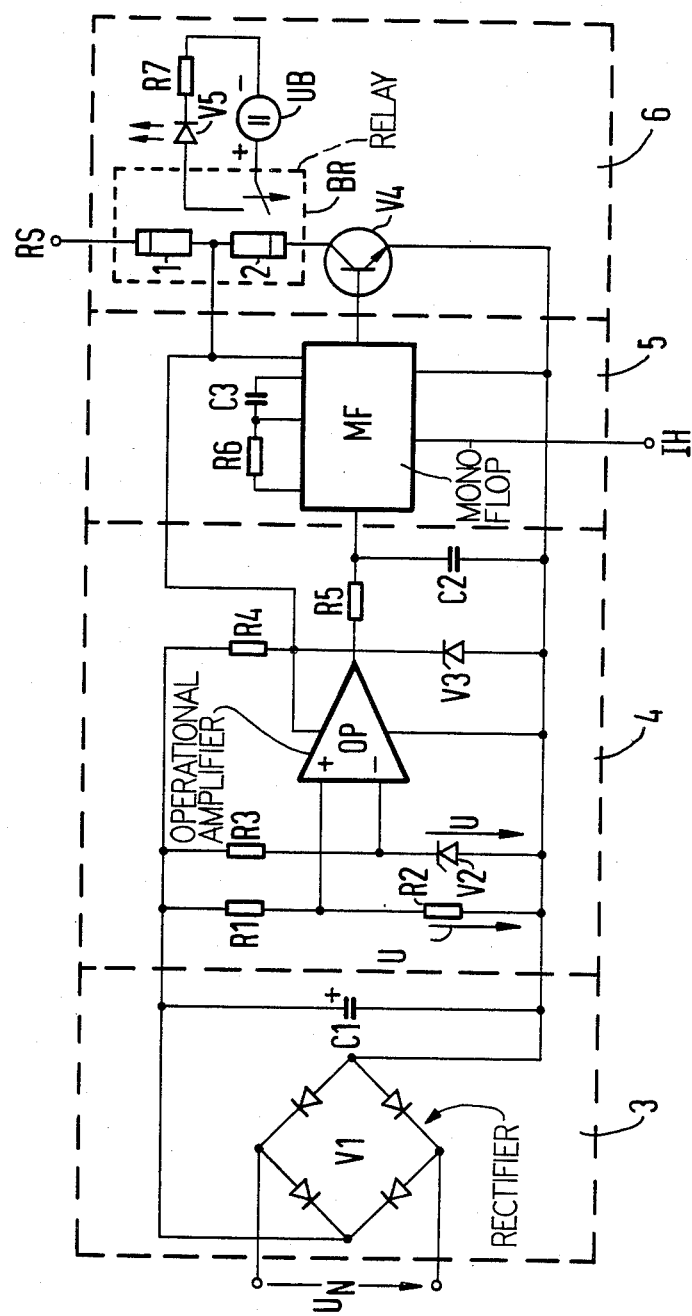
FIG. 2 is a schematic circuit diagram of the circuit illustrated in FIG. 1.

FIG. 2 illustrates a detailed circuit realization of the circuit arrangement of FIG. 1. The power line input voltage $U_N$ is rectified and smoothed via a full-wave rectifier V1 and a filter capacitor C1. The reference voltage $U_{soll}$ is generated via a Wheatstone bridge which comprises a plurality of resistors R1, R2, R3 and a Zener diode V2 which serves as a reference voltage source for the reference voltage $U_{soll}$ which is compared to the momentary actual value of the rectified power line input voltage $U_{ist}$. One input (−) of the Wheatstone bridge is connected to the junction of the Zener diode V2 and the resistor R3, whereas the non-inverting input (+) of the operational amplifier is connected to the junction of the resistors R1 and R2. When the actual value falls below the reference value, then the output of the operational amplifier OP jumps from the L level to the H level. A monoflop MF is set with this edge change. In accordance with the time constants of a capacitor C3 and a resistor R6, the output of the monoflop assumes the level H and through-connects a transistor V4 during this interval, the base of the transistor V4 being connected to the output of the monoflop MF. A bistable relay BR serves as a register or memory and is connected in a collector circuit of the transistor, the relay BR comprising two windings 1, 2 which conduct the collector current so that switch contacts of the relay open. As a result thereof, a light-emitting diode V5 is extinguished the contacts of the relay lying in its energizing circuit, and the fault report is stored. When the power line input voltage is now removed, the signal IH (inhibit) must previously be applied to the monoflop MF, the information is retained. The signals RS (reset) and IH (inhibit) are externally supplied; they can also be derived from the logic of a suitable power supply. The supply voltage for the overall circuit is directly taken from the rectified power line input voltage and is generated over a resistor R4 and a further Zener diode V3, whereby the resistor R4 is connected between one corner of the rectifier bridge V1 and the cathode of the Zener diode V3, whereas the Zener diode V3 is connected between the resistor R4 and the opposite corner of the rectifier bridge V1. A filter circuit comprising a resistor R5 and a capacitor C2 is provided between the operational amplifier OP and the monoflop MF, the filter circuit causing suppression of noise pulses. A resistor R7 serves as a dropping resistor for the light-emitting diode V5 which is supplied over a DC voltage source UB given a closed relay contact. The two windings of the bistable relay BR are bridged by two diodes V6, V7 which exercise a protective effect for the transistor V5 and the drive electronics.

Although I have described my invention by way of a particular illustrative embodiment thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A circuit arrangement for detecting and storing power line faults, comprising:

a rectifier for connection to a power line and rectifying the power line voltage;

a comparison circuit connected to a reference voltage and to said rectifier for comparing the rectified voltage to the reference voltage and producing a predetermined voltage when the rectified voltage falls below the reference voltage;

a memory connected to said comparison circuit and responsive to the predetermined voltage to assume a predetermined storage state and including an inhibit input for receiving an inhibit signal during a start-up mode for disconnecting the arrangement between start-up so that an error display occurs; and display means connected to said memory and operable in response to said predetermined storage state.

2. The circuit arrangement of claim 1, wherein:

said comparison circuit comprises an operational amplifier including an inverting input, a non-inverting input and an output, a Wheatstone bridge connected to said rectifier and including a first output connected to said non-inverting input and a second output connected to said inverting input, said Wheatstone bridge further comprising a Zener diode in one arm thereof and connected to said second output for producing the reference voltage;

said memory comprises a monoflop connected to and driven by said operational amplifier, said monoflop including said inhibit input for receiving an inhibit signal during a start-up mode, and a bistable relay connected to and driven by said monoflop, said bistable relay including relay contacts and a reset input for receiving a reset signal; and said display means comprises a light-emitting diode for connection to an energizing source via said relay contacts.

* * * * *